(12) United States Patent
Lee

(10) Patent No.: US 10,050,057 B2
(45) Date of Patent: Aug. 14, 2018

(54) SEMICONDUCTOR DEVICE AND MANUFACTURING METHOD THEREOF

(71) Applicant: SK hynix Inc., Gyeonggi-do (KR)

(72) Inventor: Nam Jae Lee, Chungcheongbuk-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 15/832,356

(22) Filed: Dec. 5, 2017

(65) Prior Publication Data

US 2018/0108673 A1    Apr. 19, 2018

Related U.S. Application Data

(62) Division of application No. 15/170,558, filed on Jun. 1, 2016, now Pat. No. 9,865,615.

(30) Foreign Application Priority Data

Jan. 8, 2016    (KR) .................... 10-2016-0002680

(51) Int. Cl.

| | | |
|---|---|---|
| *H01L 23/528* | (2006.01) | |
| *H01L 27/115* | (2017.01) | |
| *H01L 27/11582* | (2017.01) | |
| *H01L 27/1157* | (2017.01) | |
| *H01L 27/11565* | (2017.01) | |
| *H01L 23/522* | (2006.01) | |
| *H01L 21/768* | (2006.01) | |
| *H01L 29/417* | (2006.01) | |
| *H01L 27/11504* | (2017.01) | |

(52) U.S. Cl.
CPC .. *H01L 27/11582* (2013.01); *H01L 21/76816* (2013.01); *H01L 21/76877* (2013.01); *H01L 23/528* (2013.01); *H01L 23/5226* (2013.01); *H01L 27/1157* (2013.01); *H01L 27/11565* (2013.01); *H01L 27/11504* (2013.01); *H01L 29/41741* (2013.01)

(58) Field of Classification Search
CPC ........... H01L 27/11504; H01L 23/5226; H01L 29/41741
USPC .................................................. 257/330, 776
See application file for complete search history.

(56) References Cited

U.S. PATENT DOCUMENTS 8,264,018 B2 *   9/2012   Yoon ..................... H01L 27/228
                                                    257/278
8,933,505 B2 *   1/2015   Jang .................. H01L 27/11551
                                                    257/329

(Continued)

OTHER PUBLICATIONS

Office Action issued by the United States Patent and Trademark Office for U.S. Appl. No. 15/832,384 in the same family tree dated May 31, 2018.

*Primary Examiner* — George Fourson, III

(74) *Attorney, Agent, or Firm* — IP & T Group LLP

(57) ABSTRACT

A semiconductor device includes bit lines extending along a first direction, the bit lines being arranged along a second direction intersecting the first direction, a plurality of channel layers disposed under the bit lines, the plurality of channel layers extending in a third direction perpendicular to a plane extending along the first and second directions and spaced apart along the second direction, so that each channel layer is at least partially overlapped with at least two of the bit lines, and a contact plug extending, from the channel layer, toward one of the bit lines overlapped with the channel layer.

7 Claims, 16 Drawing Sheets

(56) References Cited

U.S. PATENT DOCUMENTS

| | | | |
|---|---|---|---|
| 9,070,446 B1 | 6/2015 | Aritome | |
| 9,748,264 B1* | 8/2017 | Jiang | H01L 27/11582 |
| 9,859,337 B2* | 1/2018 | Ratnam | H01L 27/2481 |
| 9,905,573 B1* | 2/2018 | Mada | H01L 27/11582 |
| 2006/0197115 A1 | 9/2006 | Toda | |
| 2007/0236979 A1* | 10/2007 | Takashima | G11C 11/22 365/145 |
| 2009/0166682 A1 | 7/2009 | Scheuerlein | |
| 2009/0236656 A1* | 9/2009 | Sung | H01L 27/10876 257/329 |
| 2012/0273965 A1* | 11/2012 | Seo | H01L 27/11565 257/774 |
| 2014/0138609 A1* | 5/2014 | Satoh | H01L 27/228 257/5 |
| 2014/0264525 A1* | 9/2014 | Takahashi | H01L 27/115 257/314 |
| 2016/0293621 A1 | 10/2016 | Huang et al. | |
| 2017/0243881 A1* | 8/2017 | Shin | H01L 21/28052 |
| 2018/0069016 A1* | 3/2018 | Barbato | H01L 27/11582 |

* cited by examiner

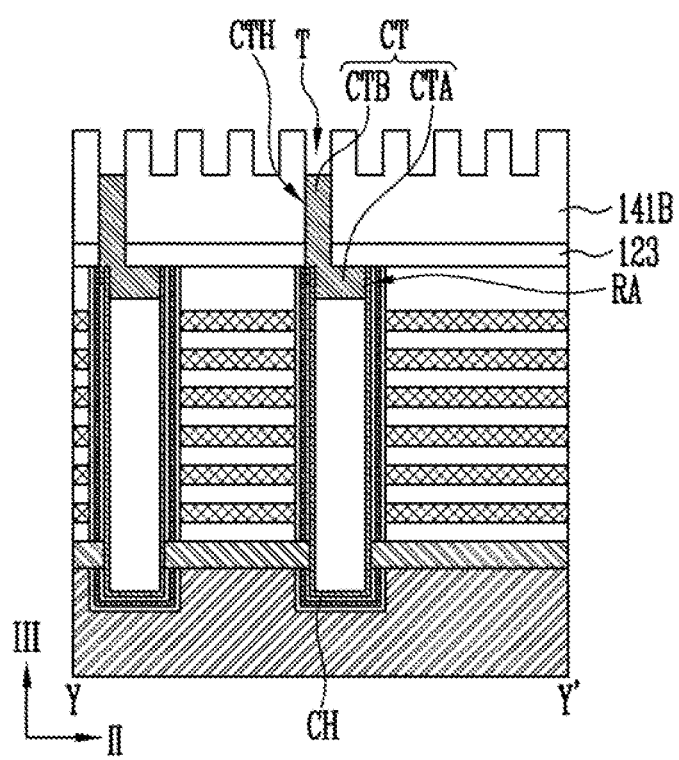

SEMICONDUCTOR DEVICE AND MANUFACTURING METHOD THEREOF

CROSS-REFERENCE TO RELATED APPLICATION

This application is a division of U.S. patent application Ser. No. 15/170,558 filed on Jun. 1, 2016 which claims priority to Korean patent Application No. 10-2016-0002680, filed on Jan. 8, 2016. The disclosure of each of the foregoing applications is incorporated herein by reference in its entirety.

BACKGROUND

1. Field

An aspect of the present disclosure relates generally to a semiconductor device and, more particularly, to a semiconductor device including a three-dimensional memory device and a manufacturing method thereof.

2. Description of the Related Art

A two-dimensional (2D) semiconductor device may include two-dimensionally arranged memory cells. Improvements in two-dimensional semiconductor devices for enhancing the degree of integration of memory cells have reached a plateau. For further increasing the degree of integration of memory cells in a memory device, there have been proposed three-dimensional (3D) structures for semiconductor devices, i.e., structures which arrange the memory cells in three-dimensional arrangements.

A typical three-dimensional semiconductor device includes a cell string having a three-dimensional structure. The cell string having the three-dimensional structure includes memory cells stacked over a substrate while being spaced apart from each other, and a channel layer extending along the stacking direction of the memory cells, the channel layer connecting the memory cells in series to each other. One end of the channel layer may be connected to a bit line. The bit line and the channel layer may be electrically connected to each other via a contact plug disposed therebetween. The contact plug may be formed using photolithography process.

As the size of the contact plug decreases, it is required to more precisely control the photolithography process, and therefore, manufacturing cost may increase.

After a contact plug is formed, a bit line may be disposed on the contact plug. When a plurality of bit lines is densely arranged, there may occur a manufacturing defect in that that two or more bit lines are connected to one contact plug.

SUMMARY

According to an aspect of the present disclosure, there is provided a semiconductor device including: bit lines extending along a first direction, the bit lines being arranged along a second direction intersecting the first direction; a plurality of channel layers disposed under the bit lines, the plurality of channel layers extending in a third direction perpendicular to a plane extending along the first and second directions and spaced apart along the second direction, so that each channel layer is at least partially overlapped with at least two of the bit lines; and a contact plug extending, from the channel layer, toward one of the bit lines overlapped with the channel layer.

According to an aspect of the present disclosure, there is provided a semiconductor device including: a stack including interlayer dielectric layers and conductive patterns, which are alternately stacked; a channel layer penetrating the stack; an upper insulating layer formed over the stack to cover the channel layer; a bit line disposed in the upper insulating layer while being spaced apart from the channel layer, the bit line being overlapped with a portion of the channel layer; and a contact plug having the same width as the bit line in a width direction perpendicular to the extending direction of the bit line, the contact plug penetrating the upper insulating layer, the contact plug extending toward the bit line from the channel layer.

According to an aspect of the present disclosure, there is provided a method of manufacturing a semiconductor device, the method including: forming a stack including first material layer and second material layers, which are alternately stacked; forming a channel layer penetrating the stack; forming an upper insulating layer over the stack to cover the channel layer; forming a first mask pattern including a first opening on the upper insulating layer; etching the upper insulating layer by a partial thickness through an etching process using the first mask pattern as an etching barrier, thereby forming a trench partially overlapped with the channel layer in the upper insulating layer; forming, on the first mask pattern, a second mask pattern including a second opening through which a partial area of the trench overlapped with the channel layer is opened; and etching the upper insulating layer exposed in an area in which the first opening and the second opening are overlapped with each other, thereby forming a contact hole through which the channel layer is exposed.

DETAILED DESCRIPTION

Figure 1A:
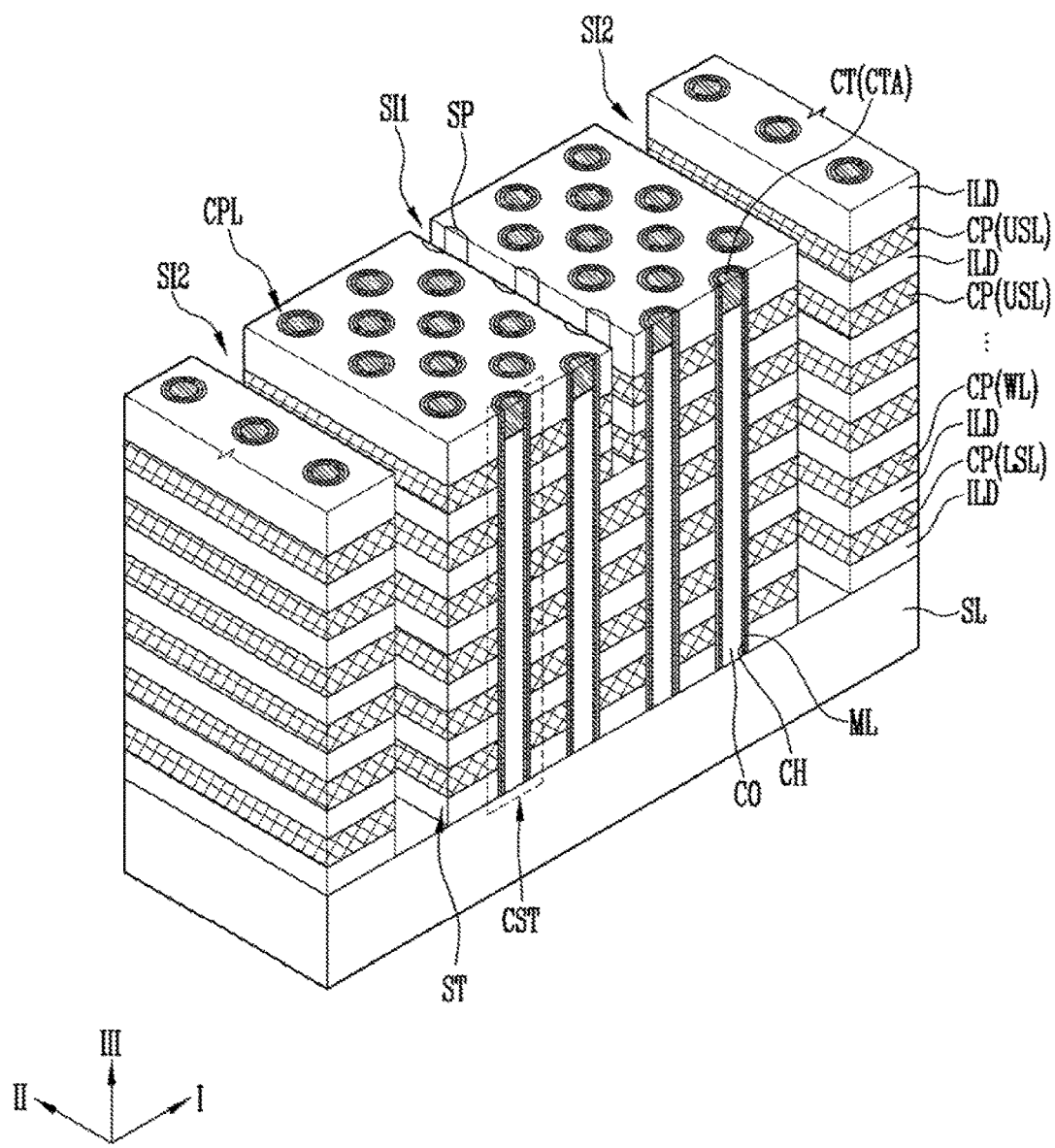
FIGS. 1A and 1B are perspective views illustrating structures of cell strings of semiconductor devices, according to embodiments of the present invention.

Hereinafter, exemplary embodiments of the present invention will be described in detail with reference to the accompanying drawings. However, the present invention is not limited to the embodiments but may be implemented into different forms. These embodiments are provided only for illustrative purposes and for full understanding of the scope of the present invention by those skilled in the art. Further, the scope of the present invention should be understood as defined by the appended claims.

In the drawing figures, dimensions may be exaggerated for clarity of illustration. Further, it will be understood that when an element is referred to as being "between" two elements, it can be the only element between the two elements, or one or more intervening elements may also be present. Like reference numerals refer to like elements throughout.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

In some instances, as would be apparent to those skilled in the relevant art elements described in connection with a particular embodiment may be used singly or in combination with other embodiments unless otherwise specifically indicated.

Hereinafter, the various embodiments of the present invention will be described in detail with reference to the attached drawings.

Figure 1B:
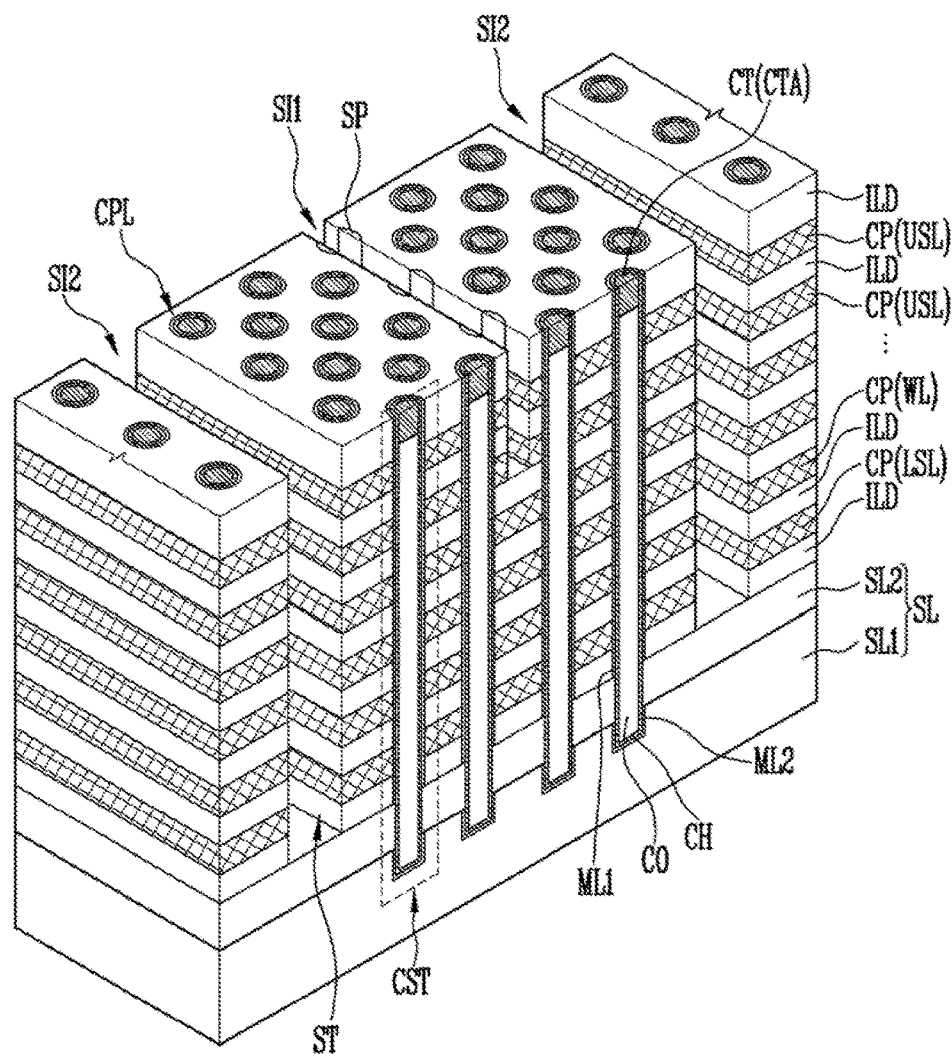

FIGS. 1A and 1B are perspective views illustrating structures of cell strings of semiconductor devices according to embodiments of the present invention. For convenience of illustration, components filled in first and second slits and components disposed over a channel layer are not shown in FIGS. 1A and 1B.

Referring to FIGS. 1A and 1B, each of the semiconductor devices may include interlayer dielectric layers ILD and conductive patterns CP, which are alternately stacked on a source line SL. Each of the interlayer dielectric layers ILD and the conductive patterns CP may have a plane extending along a first direction I and a second direction II vertically intersecting the first direction I.

At least portions of the interlayer dielectric layers ILD and the conductive patterns CP may be penetrated by first and second slits SI1 and SI2. For example, the interlayer dielectric layers ILD and the conductive patterns CP may be separated into stack structures ST by the second slits SI2 penetrating the interlayer dielectric layers ILD and the conductive patterns CP. The stack structures ST may compose memory blocks, respectively. Each of the second slits SI2 may extend along the second direction II. The first slit SI1 may penetrate a portion of an upper portion of each of the stack structures ST. The first slit SI1 extends along the second direction II, and is formed with a shallower depth than the second slits SI2. Each of the stack structures ST may include upper select lines USL separated by the first slit SI1.

Each of the semiconductor devices may further include supporting poles SP arranged along the extending direction of the first slit SI1 while being spaced apart from each other. The supporting poles SP penetrate portions of the interlayer dielectric layers ILD and the conductive patterns CP, and portions of the supporting poles SP may be penetrated by the first slit SI1.

Each of the stack structures ST may include a plurality of cell strings CST. The cell strings CST may include memory cells stacked along string poles CPL. One cell string CST may include memory cells in at least one column, which are stacked along one string pole CPL.

The string poles CPL may penetrate the stack structures ST. That is, the string poles CPL may be surrounded by any one of the stack structures ST including the interlayer dielectric layers ILD and the conductive patterns CP, which are alternately stacked. The string poles CPL may be arranged in a zigzag pattern toward the first slit SI1 from the second slits SI2. String poles CPL arranged along a straight line extending in the second direction II are defined as a string column. Each of the stack structures ST may be penetrated by a plurality of string columns.

Arranging the string poles CPL in the aforementioned zigzag pattern, results in an increased degree of integration of the memory cells. Each of the string poles CPL includes a channel layer CH. The channel layer CH may be formed in an embedded shape completely filled in a central area of each of the string poles CPL. Alternatively, as shown in these figures, the channel layer CH may be formed in a tubular shape surrounding a core insulating layer CO. When the channel layer CH is formed in the tubular shape, the height of the core insulating layer CO may be formed lower than that of the channel layer CH. In some embodiments, the channel layer CH may be formed higher than the core insulating layer CO, and an inner wall of the channel layer CH may be exposed over the core insulating layer CO. The inner wall of the channel layer CH over the core insulating layer CO may be contacted with a first portion CTA of a contact plug CT. A detailed structure of the contact plug CT will be described later with reference to FIGS. 2A to 2C.

The channel layer CH may be formed to leave open a bottom surface of the core insulating layer CO as shown in FIG. 1A, or may extend along the bottom surface of the core insulating layer CO as shown in FIG. 1B. The channel layer CH may be formed of a semiconductor layer. For example, the channel layer CH may be formed of an undoped semiconductor material layer, such as, for example, silicon layer or a doped silicon layer. The contact plug CT may be formed of a semiconductor material layer including a dopant having a higher concentration than any dopant employed in the channel layer CH. The contact plug CT may be formed of a semiconductor layer grown using the channel layer CH as a seed layer. For example, the contact plug CT may also be formed of a doped silicon layer. The first portion CTA of the contact plug CT may be used as a junction of each of the cell strings CST.

The conductive patterns CP of each of the stack structures ST may include an upper select line USL, a lower select line LSL, and word lines WL. The word lines WL are disposed at a level above the lower select line LSL, and the upper select line USL is disposed at a level above the word lines WL. The lower select line LSL may be stacked in one or two or more layers under the word lines WL. The upper select lines USL may be stacked in one or two or more layers over the word lines WL.

The source line SL may be disposed beneath the stack structures ST.

Figure 2A:
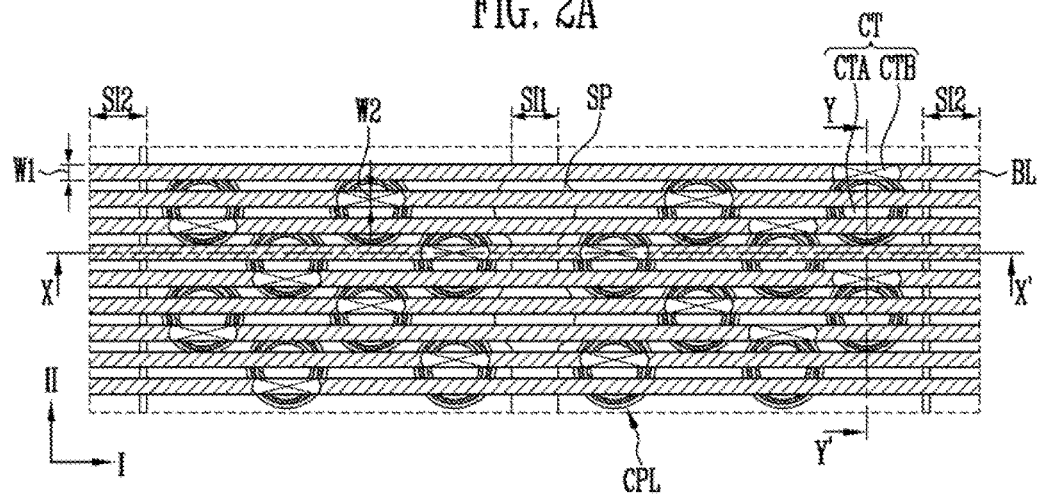
FIGS. 2A to 2C are views illustrating a connection relationship between a channel layer and a bit line in a semiconductor device, according to an embodiment of the present invention.
Figure 2B:
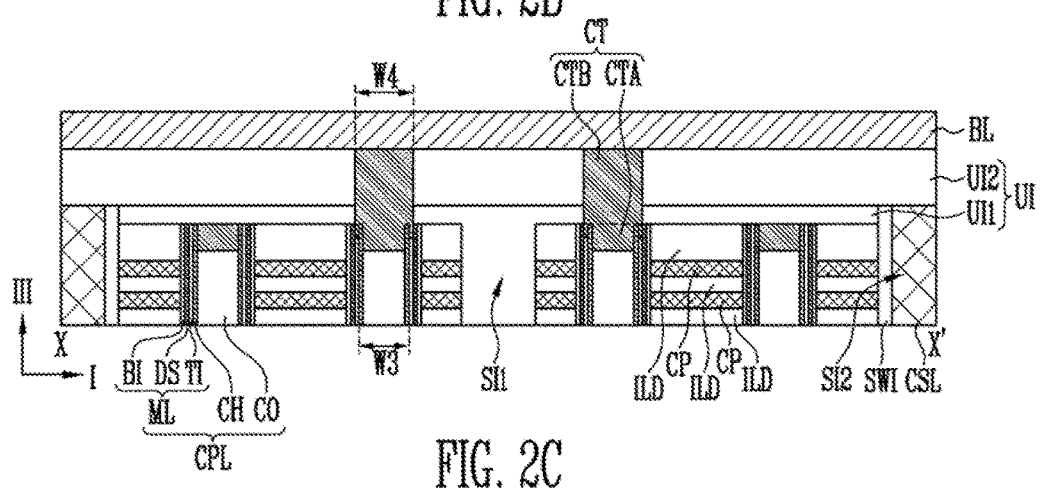
Figure 2C:
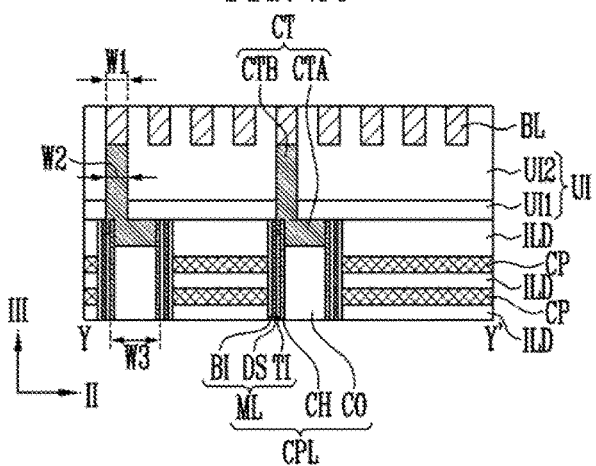

As shown in FIG. 1A, the source line SL may be contacted with the bottoms of the string poles CPL. More specifically, the source line SL may be electrically connected to the channel layers CH of the string poles CPL. The source layer SL may be a portion of a semiconductor substrate into which a dopant is implanted. The source layer SL may be a doped silicon layer formed on the semiconductor substrate. An outer wall of the channel layer CH may be surrounded by a multi-layered layer ML. The multi-layered layer ML may include a tunnel insulating layer TI, a data storage layer DS, and a blocking insulating layer BI as shown in FIGS. 2A to 2C. The tunnel insulating layer TI comes in contact with the outer wall of the channel layer CH, and may be formed along the shape of the outer wall of the channel layer CH. The data storage layer DS comes in contact with an outer wall of the tunnel insulating layer, and may be formed along the shape of the outer wall of the tunnel insulating layer TI. The blocking insulating layer BI comes in contact with an outer wall of the data storage layer, and may be formed along the shape of the outer wall of the data storage layer. Although not shown in this figure, the multi-layered layer ML may be formed along sidewalls of each of the conductive patterns CP, adjacent to the channel layer CH, and upper and lower surfaces of each of the conductive patterns CP. In some embodiments, the multi-layered layer ML may be separated by the first and second slits SI1 and SI2, to have a C-shaped section.

As shown in FIG. 1B, the source line SL may include a first source layer SL1 and a second source layer SL2 disposed on the first source layer SL1. The first source layer SL1 may surround lower ends of the string poles CPL. That is, the lower end of each of the string poles CPL may extend to the inside of the first source layer SL1. More specifically, lower ends of the core insulating layer CO and the channel layer CH of each of the string poles CPL may be surrounded by the first source layer SL1. The second source layer SL2 is disposed between the first source layer SL1 and the stack structures ST. The second source layer SL2 may be contacted with a sidewall of the channel layer CH and a top surface of the first source layer SL1. The first and second source layers SL1 and SL2 may be formed of a doped silicon layer. Each of the string poles CPL may further include a first memory pattern ML1 and a second memory pattern ML2. The first and second memory patterns ML1 and ML2 surround the outer wall of the channel layer CH, and are separated by the second source layer SL2. Each of the first and second memory patterns ML1 and ML2 may include a tunnel insulating layer TI, a data storage layer DS, and a blocking insulating layer BI as shown in FIGS. 2A to 2C. The tunnel insulating layer TI comes in contact with the outer wall of the channel layer CH, and may be formed along the shape of the outer wall of the channel layer CH. The data storage layer DS comes in contact with an outer wall of the tunnel insulating layer TI, and may be formed along the shape of the outer wall of the tunnel insulating layer TI. The blocking insulating layer BI comes in contact with an outer wall of the data storage layer DS, and may be formed along the shape of the outer wall of the data storage layer DS.

The first memory pattern ML1 surrounds an upper outer wall of the channel layer CH, protruding upward of the source line SL. That is, the first memory pattern ML1 is disposed between the channel layer CH and each of the stack structure ST. The second memory pattern ML2 is disposed between the first source layer SL1 and the channel layer CH.

According to the structures described in FIGS. 1A and 1B, memory cells are formed at intersection portions of the channel layer CH and the word lines WL, a lower select transistor is formed at an intersection portion of the channel layer CH and the lower select line LSL, and an upper select transistor is formed at an intersection portion of the channel layer CH and the upper select line USL. One cell string CST includes a lower select transistor, memory cells, and an upper select transistor, which are arranged in a line along one channel layer CH. The lower select transistor, the memory cells, and the upper select transistor, which are arranged along the channel layer CH, may be connected in series through the channel layer CH. The word lines WL may transmit signals to gates of the memory cells, the lower select line LSL may transmit signals to a gate of the lower select transistor, and the upper select line USL may transmit signals to a gate of the upper select transistor.

The semiconductor devices described in FIGS. 1A and 1B include three-dimensional (3D) cell strings CST. The three-dimensional cell string CST may be connected to one bit line through one channel layer CH corresponding thereto. In some embodiments, the width of the bit line may be formed narrower than the width (particularly, the width of the uppermost end) of the channel layer CH. In some embodiments, two or more bit lines may at least partially overlap with the channel layer CH. A contact plug CT may be disposed between the channel layer CH and one bit line corresponding thereto so that only one of the two or more bit lines overlapped with the channel layer CH may be connected to the channel layer CH. Hereinafter, a layout of the bit line and the channel layer CH and a structure of the contact plug CT connecting the bit line and the channel layer CH to each other according to an embodiment of the present invention will be described in detail with reference to FIGS. 2A to 2C.

FIGS. 2A to 2C are views illustrating a connection relationship between a channel layer and a bit line in a semiconductor device according to an embodiment of the present invention. FIG. 2A is a plan view illustrating a layout of string poles, contact plugs, and bit lines. FIG. 2B is a sectional view taken along line X-X' shown in FIG. 2A. FIG. 2C is a sectional view taken along line Y-Y' shown in FIG. 2A. FIGS. 2A to 2C illustrate only a portion corresponding to an upper portion of the stack structure shown in FIG. 1A or 1B.

Referring to FIG. 2A, the semiconductor device includes bit lines BL extending along a first direction I, the bit lines BL arranged while being spaced apart from each other along a second direction II intersecting the first direction I. The bit lines BL may at least partially overlap with string poles CPL. More specifically, the bit lines BL are arranged to be partially overlapped with channel layers CH of the string poles CPL.

At least two bit lines BL may at least partially overlap with each of the string poles CPL. That is, at least two bit lines BL may at least partially overlap with one string pole CPL. The string poles CPL may be divided into a plurality of sub-groups according to stack structures separated by second slits SI2.

A first slit SI1 may be disposed between the second slits SI2. Supporting poles SP may be arranged along the extending direction of the first slit SI1. The supporting poles SP may at least partially overlap with the first slit SI1.

The bit lines BL may at least partially overlap with the first and second slits SI1 and SI2. Each of the bit lines BL may be connected to contact plugs CT. The contact plugs CT may be connected to the string poles CPL one by one. More specifically, one contact plug CT may be connected to one string pole CPL corresponding thereto. Also, one contact plug CT may be connected one bit line BL corresponding thereto. The contact plug CT may be connected to the channel layer CH of the string pole CPL.

Each of the contact plugs CT may include a first portion CTA surrounded by the channel layer CH and a second portion CTB extending toward the bit line BL from the first portion CTA. Alternatively, each of the contact plugs CT may include only the second portion CTB. In some embodiments, an area in which the first portion CTA is disposed may be filled with the channel layer CH, and the second portion CTB may be contacted with the channel layer CH. The second portion CTB may be disposed between the bit line BL and the string pole CPL.

The second direction II vertically intersecting the first direction I that is the extending direction of the bit lines BL may be defined as a width direction. Each of the bit lines BL may be formed with a first width W1 along the second direction II. The second portion CTB of each of the contact plugs CT may be formed with a second width W2 along the second direction II. That is, the second width W2 of the second portion CTB is a second-direction diameter of the second portion CTB. In some embodiments, the first width W1 and the second width W2 may be equal to each other. As the width of the second portion CTB corresponding to the uppermost end of the contact plug CT is controlled to be equal to that of the bit line BL as described above, it is possible to prevent a failure that the contact plug CT is not connected to the bit line corresponding thereto but connected to another bit line.

The channel layer CH of each of the string poles CPL may be formed with a third width (W3 of FIG. 2B) along the second direction II. That is, the third width W3 of the channel layer CH is a second-direction diameter of the channel layer CH. Each of the first and second widths W2 and W3 may be formed narrower than the third width W3. In other words, the third width W3 corresponding to the second-direction diameter of the channel layer CH may be greater than the second width W2 corresponding to the second-direction diameter of the second portion CTB of the contact plug CT, protruding upward of the channel layer CH.

Referring to FIGS. 2B and 2C, the string poles CPL penetrate interlayer dielectric layers ILD and conductive patterns CP, which are alternately stacked as described in FIGS. 1A and 1B. Each of the string poles CPL may include a multi-layered layer ML surrounding the channel layer CH as described in FIGS. 1A and 1B. The multi-layered layer ML, as described in FIGS. 1A and 1B, may include a tunnel insulating layer TI, a data storage layer DS, and a blocking insulating layer BI. Each of the string poles CPL may further include a core insulating layer CO. The core insulating layer CO is formed lower than the channel layer CH, and may be surrounded by the channel layer CH. The channel layer CH may extend along a third direction III perpendicular to a plane extending along the first and second directions I and II.

At least portions of the interlayer dielectric layers ILD and the conductive patterns CP, which are alternately stacked, may be penetrated by the first and second slits SI1 and SI2. The inside of the first slit SI1 may be filled with a first upper insulating layer UI1. Alternatively, the inside of the first slit SI1 may be filled with a slit insulating layer formed separately from the first upper insulating layer UI1. A sidewall insulating layer SWI may be formed on a sidewall of each of the second slits SI2. The inside of each of the second slits SI2 may be filled with a common source line CSL. The sidewall insulating layer SWI may insulate between the common source line CSL and the conductive patterns CP. The common source line CSL may be connected to the source line SL described in FIGS. 1A and 1B.

An upper insulating layer UI may be formed over a stack structure of the interlayer dielectric layers ILD and the conductive patterns CP. The upper insulating layer UI may include the first upper insulating layer UI1 and a second upper insulating layer UI2 formed on the first upper insulating layer UI1. Alternatively, the upper insulating layer UI may be formed with a single insulating layer or three or more insulating layers. The upper insulating layer UI may be formed to cover the string poles CPL.

The bit lines BL are arranged in the upper insulating layer UI, and may be arranged to be overlapped with portions of the string poles CPL. For example, the bit lines BL may be arranged in the second upper insulating layer UI2. The bit lines BL may be arranged at positions spaced apart from the string poles CPL. That is, the upper insulating layer UI may remain with a partial thickness between the bit lines BL and the string poles CPL. For example, a portion of the second upper insulating layer UI2 and the first upper insulating layer UI1 may remain between the bit lines BL and the string poles CPL.

As described in FIG. 2A, each of the bit lines BL may be formed with the first width W1 narrower than the third width W3. Thus, two or more bit lines BL may at least partially overlap with each of the string poles CPL over the string poles CPL. In order to connect one bit line BL to one string pole CPL corresponding thereto, the second portion CTB of the contact plug CT, penetrating the upper insulating layer UI, may be disposed between the string pole CPL and the bit line BL.

In some embodiments, the widths or diameters of the uppermost end of the contact plug CT in the first and second direction I and II may be different from each other. The width in the second direction II of the uppermost end of the contact plug CT that is a width direction vertically intersecting the bit line BL is defined as the second width W2, and the width in the first direction I of the uppermost end of the contact plug CT that is the extending direction of the bit line BL is defined as a fourth width W4. In other words, the second width W2 of the contact plug CT is a second-direction diameter of the contact plug CT, and the fourth width W4 of the contact plug CT is a first-direction diameter of the contact plug CT. The second width W2 or second-direction diameter of the contact plug CT may be equal to the first width W1 of the bit line BL as described in FIG. 2A. The fourth width W4 or first-direction diameter of the contact plug CT may be formed greater than the second width W2 or second-direction diameter of the contact plug CT. The second portion CTB of the contact plug CT, protruding upward of the channel layer CH, completely covers the channel layer CH in the first direction I, and may cover a portion of the channel layer CH in the second direction II.

When the channel layer CH is formed in a tubular shape having a higher height than the core insulating layer CO, the contact plug CT may include first and second portions CTA and CTB formed with different widths from each other. The first portion CTA is a portion extending toward a central area of the channel layer CH under the upper insulating layer UI. The first portion CTA comes in contact with an inner wall of the channel layer CH to be surrounded by the channel layer CH, and is disposed on the core insulating layer CO. The second portion CTB extends from the first portion CTA to come in contact with one bit line corresponding thereto among the bit lines BL. The second portion CTB penetrates the upper insulating layer UI. The second and fourth widths W2 and W4 are defined as widths of the uppermost end of the second portion CTB. The first portion CTA may be formed with a wider width than the second portion CTB. The first portion CTA may be formed to completely fill in the central area of the channel layer CH over the core insulating layer CO.

Although not shown in these figures, when the channel layer CH is formed in an embedded shape completely filled in a central area of the string pole CPL, an area in which the core insulating layer CO and the first portion CTA are disposed may be completely filled with the channel layer CH. In addition, the contact plug CT penetrates the upper insulating layer UI, and may include only the second portion CTB protruding upward of the channel layer CH.

In some embodiments, a portion (e.g., CTB) of the contact plug CT penetrating the upper insulating layer UI is formed with the same width as the bit line BL, so that it is possible to prevent a failure that two or more bit lines are connected to one contact plug.

Although not shown in these figures, a plurality of contact plugs stacked in multiple layers may be arranged between the bit line BL and the channel layer CH. As compared with this case, in some embodiments, the bit line BL and the channel layer CH may be connected through the integrated single contact plug CT, thereby simplifying a manufacturing process of the semiconductor device. Further, in some embodiments, the height of the contact plug CT disposed between the bit line BL and the channel layer CH may be lowered, so that it is possible to reduce the time required to precharge the bit line BL by decreasing the capacitance between adjacent contact plugs. Accordingly, it is possible to reduce a program time.

In some embodiments, the contact plug is formed of selective epitaxial growth (SEG), so that the contact resistance between the bit line BL and the channel layer CH may be reduced, thereby increasing cell current.

Hereinafter, a manufacturing method of a semiconductor device according to an embodiment of the present invention will be described with reference to FIGS. 3A to 9C. FIGS. 3A, 4A, 5A, 6A, 7A, 8A and 9A are plan views illustrating the manufacturing method according to the embodiment of the present invention. FIGS. 3B, 4B, 5B, 6B, 7B, 8B and 9B are sectional views taken along lines X-X' shown in FIGS. 3A, 4A, 5A, 6A, 7A, 8A and 9A, respectively. FIGS. 5C, 6C, 7C, 8C and 9C are sectional views taken along line Y-Y' shown in FIGS. 5A, 6A, 7A, 8A and 9A, respectively.

Figure 3A:
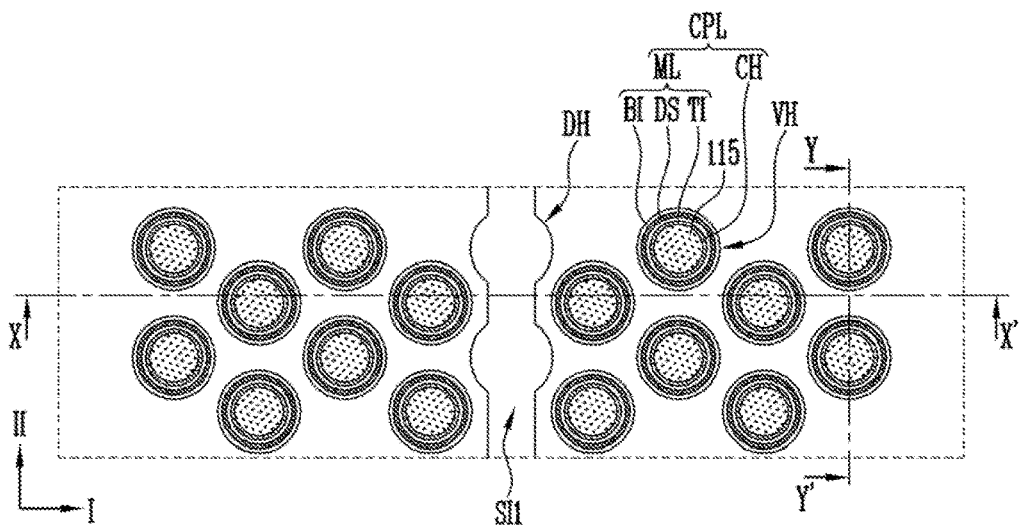
FIGS. 3A to 9C are views illustrating a manufacturing method of a semiconductor device, according to an embodiment of the present invention.
Figure 3B:
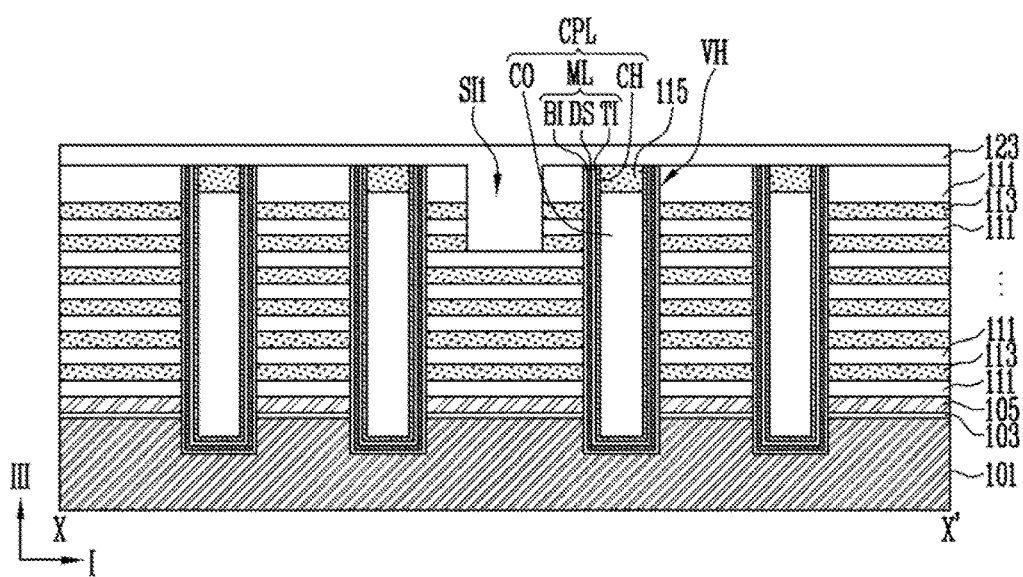

FIGS. 3A and 3B are views illustrating a process of forming string poles and a slit insulating layer.

Referring to FIGS. 3A and 3B, a preliminary source line structure is formed by sequentially stacking a first source layer 101, a protective layer 103, and a source sacrificial layer 105. Subsequently, first material layers 111 and second material layers 113 are alternately stacked on the preliminary source line structure.

The first source layer 101 may be formed of a conductive material. The first source layer 101 may be formed of a conductive material that may be used for a grow seed layer of a second source layer in a subsequent process. For example, the first source layer 101 may be formed of polysilicon. The first source layer 101 may be formed as a multi-layered layer in which a metal layer and a polysilicon layer are stacked so as to reduce the resistance of a source line. The metal layer may include a material having a lower resistance than the polysilicon layer. For example, the metal layer may include tungsten.

The protective layer 103 may be formed of a material having a different etching selection ratio from the source sacrificial layer 105. For example, the protective layer 103 may be formed of an oxide.

The source sacrificial layer 105 may be formed of a material selectively removable in a subsequent process. For example, the source sacrificial layer 105 may be formed of polysilicon.

The first material layers 111 are formed in an area in which interlayer dielectric layers are to be arranged, and the second material layers 113 may be formed in an area in which conductive patterns are to be arranged. The second material layers 113 are formed of a different material from the first material layers 111. For example, the first material layers 111 may be formed of an insulating material for interlayer dielectric layers, and the second material layers 113 may be formed of a conductive material for conductive patterns.

Alternatively, the first material layers 111 may be formed of an insulating layer for interlayer dielectric layers, and the second material layers 113 may be formed of a sacrificial insulating material having an etching selection ratio with respect to the first material layers 111. In some embodiments, the first material layers 111 may be formed, for example, of a silicon oxide layer, and the second material layers 113 may be formed, for example, of a silicon nitride layer. When both the first and second material layers 111 and 113 are formed of an insulating material, it is possible to reduce the degree of difficulty of subsequent etching processes for forming vertical hole, dummy holes, and first and second slits.

Alternatively, the first material layers 111 may be formed of a sacrificial conductive material having an etching selection ratio with respect to the second materials 113, and the second material layers 113 may be formed of a conductive material for conductive patterns. In some embodiments, the first material layers 111 may be formed of an undoped polysilicon layer, and the second material layers 113 may be formed of a doped polysilicon layer. When both the first and second material layers 111 and 113 are formed of a polysilicon layer, it is possible to reduce the degree of difficulty of etching processes for forming holes or slits.

Hereinafter, a case where first material layers 111 are formed an insulating material for interlayer dielectric layers and the second material layers 113 are formed of a sacrificial insulating material will be described as an example, the present invention is not limited thereto.

Subsequently, the first and second material layers 111 and 113 are etched, thereby forming vertical holes VH penetrating them. The sacrificial layer 105 and the protective layer 103 may be further etched for forming the vertical holes VH. At this time, a portion of the first source layer 101 may be etched. In an embodiment, the vertical holes VH penetrate the sacrificial layer 105 and the protective layer 103, and may extend to the inside of the first source layer 101. The vertical holes VH may be arranged in a zigzag pattern.

Subsequently, a channel layer CH surrounded by a multi-layered layer ML is formed inside each of the vertical holes VH. The channel layer CH surrounded by the multi-layered layer ML may be formed by sequentially performing the following processes.

First, the multi-layered layer ML is formed on a surface of each of the vertical holes VH. The multi-layered layer ML may be formed by sequentially stacking a blocking insulating layer BI, a data storage layer DS, and a tunnel insulating layer TI. The blocking insulating layer BI, the data storage layer DS, and the tunnel insulating layer TI may be formed on the surface of each of the vertical holes VH. The tunnel insulating layer TI may be formed, for example, of a silicon oxide layer, the data storage layer DS may be formed, for example, of a silicon nitride layer in which charges can be trapped, and the blocking insulating layer BI may be formed, for example, of a silicon oxide layer.

Subsequently, the channel layer CH is formed on the multi-layered layer ML. The channel layer CH may be formed to completely fill in the inside of each of the vertical holes VH, or may be formed in a tubular shape that opens a central area of each of the vertical holes VH. When the channel layer CH is formed in the tubular shape, the central area of each of the vertical holes VH may be filled with a core insulating layer CO. A radical oxidation process may be further performed before the core insulating layer CO is formed. The core insulating layer CO may include, for example, a polysilazane (PSZ) oxide layer or a conformal film deposition (CFD) oxide layer.

An upper portion of the core insulating layer CO filled up to the top end of each of the vertical holes VH may be removed using an etching process. The upper portion of the core insulating layer CO may be removed, for example, through wet etching or dry etching. The area in which the upper portion of the core insulating layer CO is removed may be filled with a capping layer 115. The capping layer 115 is a sacrificial material selectively removable in a subsequent process, and may be formed, for example, of a nitride layer.

The capping layer 115, the channel layer CH, and the multi-layered layer ML may be planarized until the stacked structure of the first and second material layers 111 and 113 is exposed. Accordingly, the capping layer 115, the channel layer CH, and the multi-layered layer ML may remain only inside each of the vertical holes VH, and each of the capping layer 115, the channel layer CH, and the multi-layered layer ML may be formed into a structure penetrating the first and second material layers 111 and 113. The multi-layered layer ML remains while surrounding the channel layer CH. Each string pole CPL includes the channel layer CH, the multi-layered layer ML, and the core insulating layer CO, which are disposed only inside each of the vertical holes VH.

Subsequently, the first material layers 111 and the second material layers 113 are etched, thereby forming dummy holes DH penetrating them. The dummy holes DH may be simultaneously formed with the vertical holes VH. In some embodiments, the capping layer 115, the channel layer CH, and the multi-layered layer ML may be formed inside each of the dummy holes DH. The dummy holes DH may be disposed while being spaced apart from each other along a second direction II.

After that, a first slit SI1 may be formed by etching portions of the first and second material layers 111 and 113. The first slit SI1 may extend along the second direction II. The first slit SI1 may at least partially overlap with the dummy holes DH. Material layers filled in an upper portion of each of the dummy holes DH may be removed during the process of forming the first slit SI1. The vertical holes VH may be disposed symmetric to each other with respect to the first slit SI1.

After that, an insulating layer filled in an upper portion of each of the first slit SI1 and the dummy holes DH may be formed. Accordingly, a slit insulating layer filled in the upper portion of each of the first slit SI1 and the dummy holes DH may be formed. A surface of the slit insulating layer may be planarized. In an embodiment, the slit insulating layer is formed only inside the upper portion of each of the first slit SI1 and the dummy holes DH. Alternatively, the slit insulating layer may remain over the first and second material layers 111 and 113 to be used as a first upper insulating layer 123. Hereinafter, a case where the slit insulating layer is used as the first upper insulating layer 123 is illustrated, and the slit insulating layer is referred to as the first upper insulating layer 123.

Figure 4A:
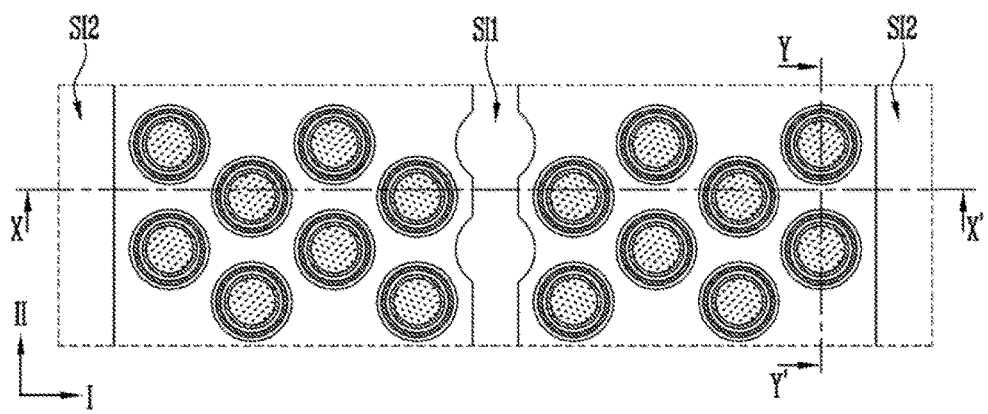
Figure 4B:
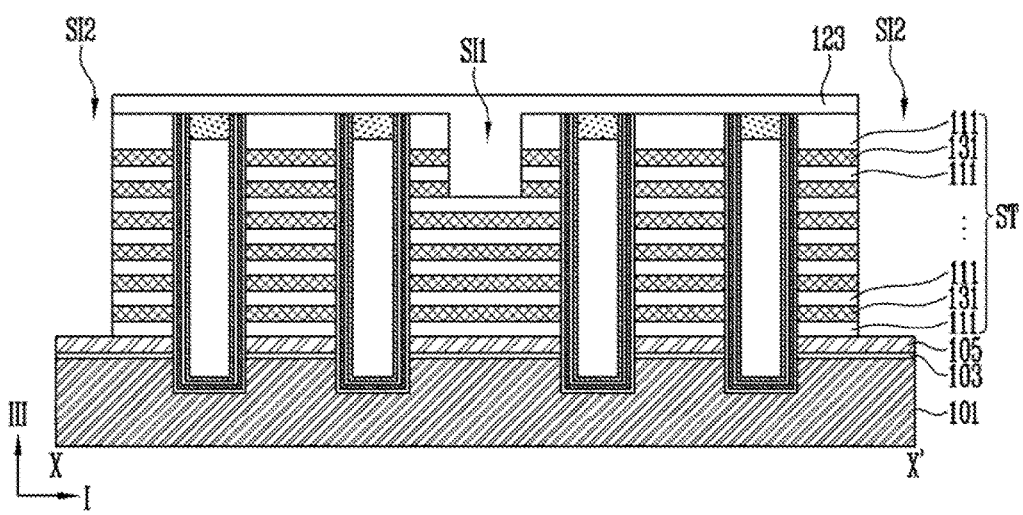

FIGS. 4A and 4B are views illustrating a process of forming second slits.

Referring to FIGS. 4A and 4B, the first upper insulating layer 123 generated by the process of FIGS. 3A and 3B may remain on the stacked structure of the first and second material layers 111 and 113 to cover the channel layers CH.

Subsequently, the first upper insulating layer 123, the first material layers 111, and the second material layers 113 are etched, thereby forming second slits SI2 penetrating them. Sidewalls of the first and second material layers 111 and 113 may be exposed by the second slits SI2. The second slits SI2 extend along the second direction II. After the second slits SI2 are formed, a subsequent process may be variously performed according to properties of the first and second material layers 111 and 113. For example, when the first material layers 111 are formed as interlayer dielectric layers and the second material layers 113 are formed as sacrificial insulating layers, the second material layers 113 may be replaced with third material layers 131 through the second slits SI2. More specifically, the second material layers 113 may be selectively removed through the second slits SI2, and areas in which the second material layers 113 are removed may be filled with the third material layers 131. The third material layers 131 may be a metal having a lower resistance than the semiconductor base material, for example a metal having a lower resistance than polysilicon. For example, the third material layers 131 may be made of or comprise tungsten.

When the first material layers 111 are formed as interlayer dielectric layers and the second material layers 113 are formed of a conductive material for conductive patterns, the second material layers 113 may remain without being replaced with the third material layers 131 after the process of forming the second slits SI2. When the first material layers 111 are formed of a sacrificial conductive material and the second material layers 113 are formed of a conductive material for conductive patterns, the first material layers 111 may be replaced with an insulating material through the second slits SI2.

As described above, various processes are performed, thereby forming a stacked structure (ST) in which interlayer dielectric layers and conductive patterns are alternately stacked.

Figure 5A:
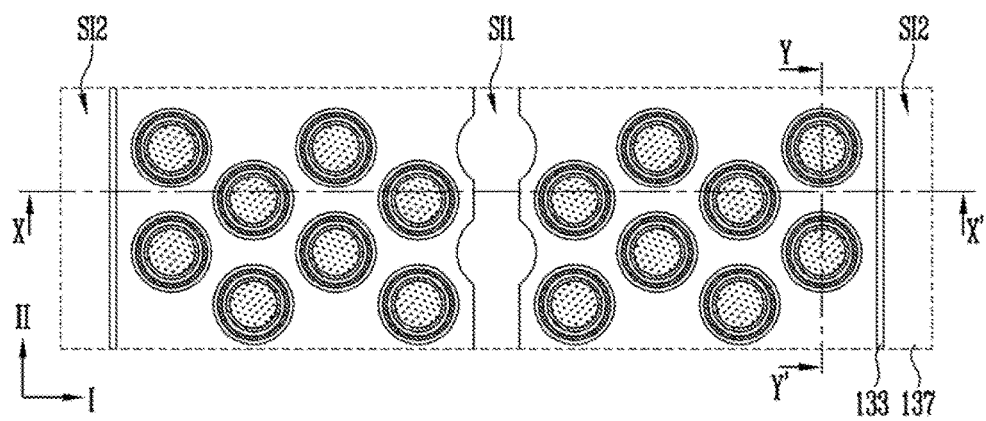
Figure 5B:
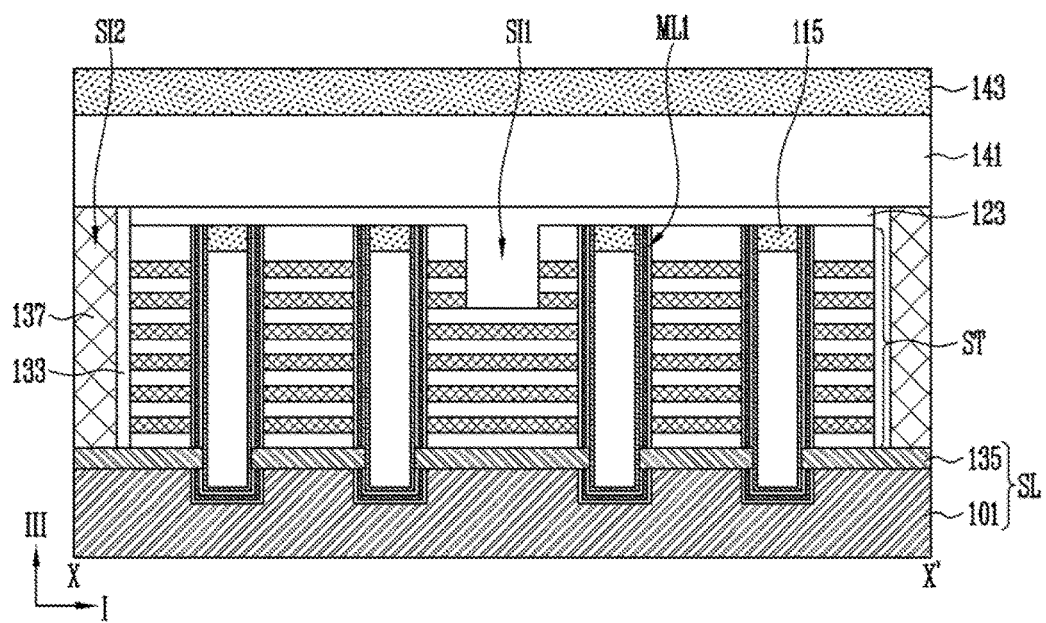
Figure 5C:
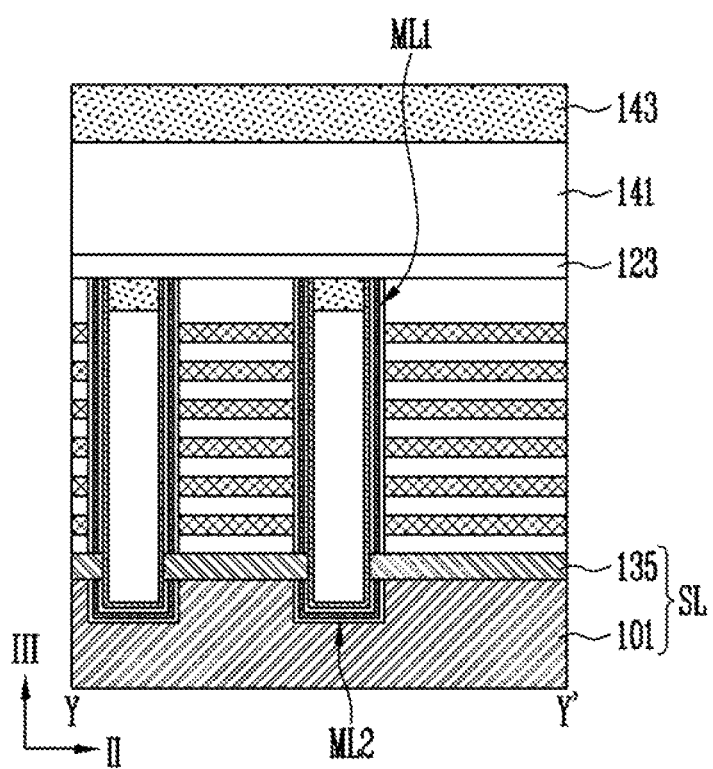

FIGS. 5A to 5C are views illustrating a process of forming a second source layer and a process of coating a first mask layer. For better illustrating a layout of components formed in the second slits, FIG. 5A illustrates a layout viewed through a second upper insulating layer and a first mask layer, which are disposed over the second slits.

Referring to FIGS. 5A to 5C, a sidewall insulating layer 133 is formed on a sidewall of each of the second slits SI2. The sidewall insulating layer 133 may be formed so that the stacked structure ST is not damaged during a subsequent process of removing the source sacrificial layer 105 and the protective layer 103 generated by the process of FIGS. 3A and 3B. The sidewall insulating layer 133 may be formed, for example, of an oxide layer or a nitride layer, or may be formed as a multi-layered layer including an oxide layer and a nitride layer.

Subsequently, the source sacrificial layer 105 is removed in a state in which the stacked structure ST is protected by the sidewall insulating layer 133. Accordingly, a portion of the multi-layered layer ML surrounding the channel layer CH may be exposed.

After that, a partial sidewall of the channel layer CH is exposed by removing the area in which the multi-layered layer ML is exposed. The protective layer 103 may be removed in the process of removing the multi-layered layer ML. The area in which the multi-layered layer ML, the protective layer 103 and the source sacrificial layer 105 are removed may be defined as a source area. The multi-layered layer ML may be separated, by the source area, into a first memory pattern ML1 and a second memory pattern ML2.

Subsequently, the source area may be filled with a second source layer 135. Accordingly, a source line SL may be formed in which the first source layer 101 and the second source layer 135 are stacked. The second source layer 135 is contacted with the first source layer 101 and the channel layer CH to be electrically connected to them.

In an embodiment, the second source layer 135 may be formed by growing an epitaxial layer from the first source layer 101 and the channel layer CH through selective epitaxial growth (SEG). In another embodiment, the second source layer 135 may be formed by filling a source conductive layer in the source area. The second source layer 135 may be formed, for example, of polysilicon.

After that, the second source layer 135 may be doped with a dopant through the second slits SI2. Any suitable dopant may be used.

Subsequently, after each of the second slits SI2 is filled with a conductive material for common source lines, a surface of the conductive material for common source lines may be planarized until the first upper insulating layer 123 is exposed. Accordingly, a common source line 137 may be formed only inside each of the second slits SI2. The conductive material for common source lines may include a barrier metal layer and a metal layer. For example, the barrier metal layer may be formed into a double-layered structure of a titanium layer and a titanium nitride layer. The metal layer may, for example, include tungsten.

After that, a second upper insulating layer 141 may be formed on the first upper insulating layer 123 to cover the common source lines 137. Subsequently, a first mask layer 143 is formed on the second upper insulating layer 141. The first mask layer 143 may be formed of a material having an etching selection ratio with respect to the second and first upper insulating layers 141 and 123. More specifically, the first mask layer 143 may be formed of a material that is removable without any loss of the first and second upper insulating layers 123 and 141. For example, the first mask layer 143 may include, for example, at least one of nitride, TiN, and tungsten. The first and second upper insulating layers 123 and 141 may be formed, for example, of an oxide layer.

Figure 6A:
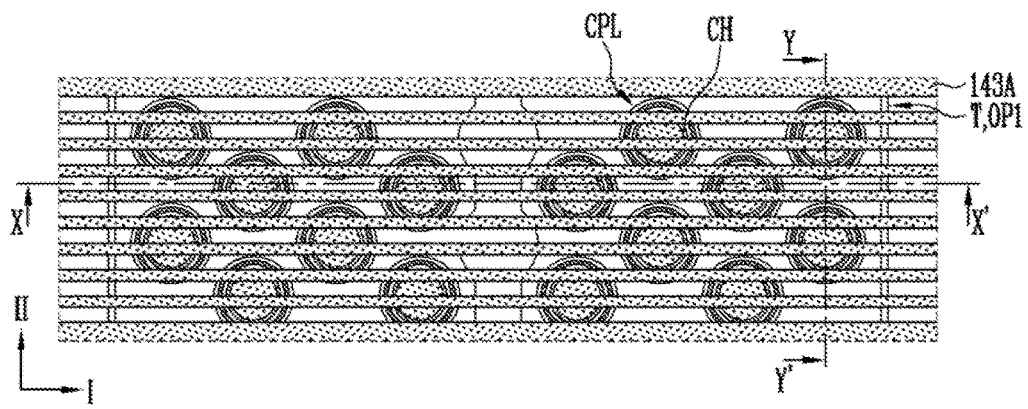
Figure 6B:
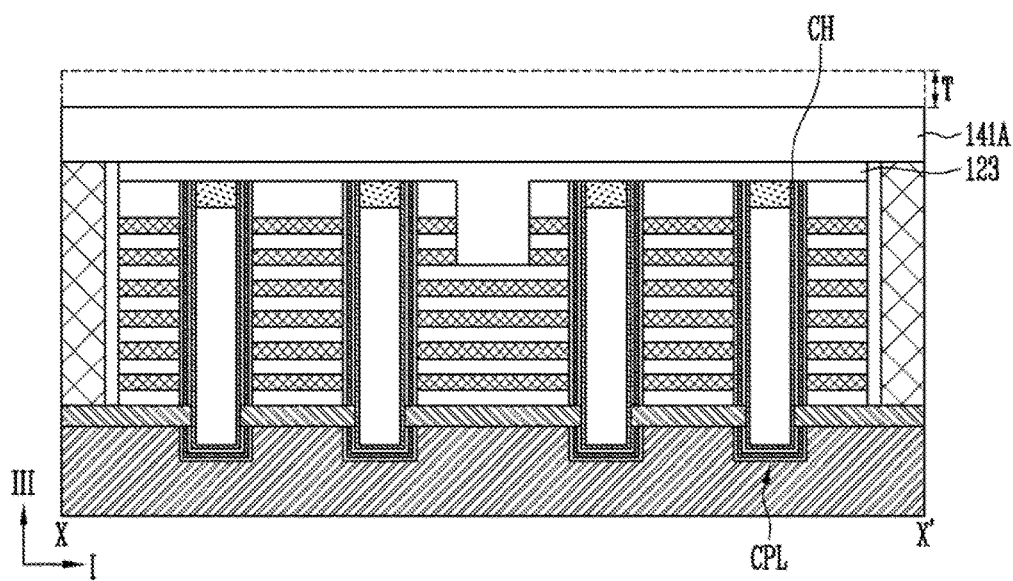
Figure 6C:
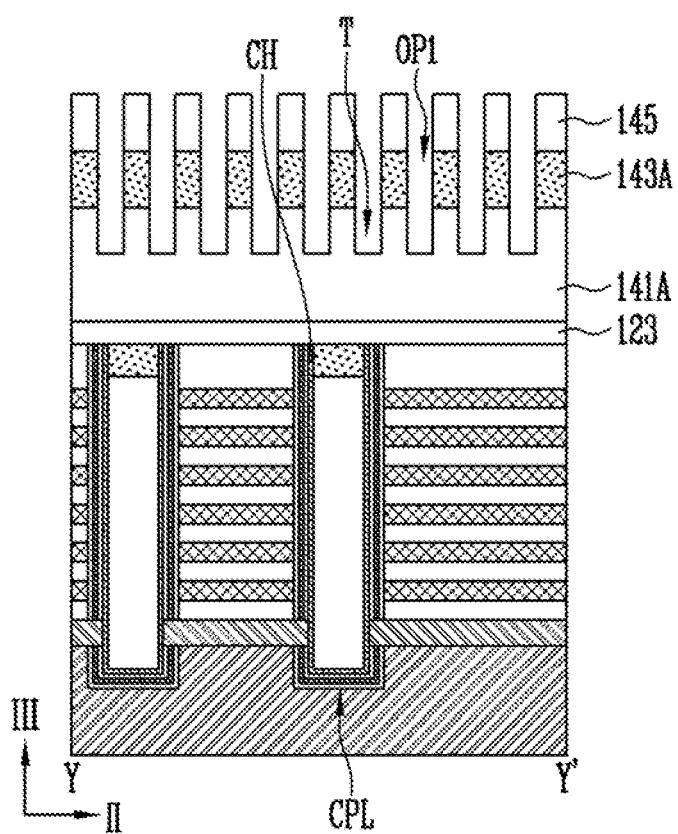

FIGS. 6A to 6C are views illustrating a process of forming trenches. FIG. 6A illustrates a layout viewed through the first and second upper insulating layers disposed over the channel layers.

Referring to FIGS. 6A to 6C, a second mask layer is formed on the first mask layer 143 and then patterned, thereby forming a second mask pattern 145. The second mask layer may be a photoresist layer, and the second mask pattern 145 may be a photoresist pattern formed using a photolithography process.

Subsequently, the first mask layer 143 generated by the process of FIGS. 5A to 5C is etched through an etching process using the second mask pattern 145 as an etching barrier. Accordingly, a trench-type first mask pattern 143A including a first opening OP1 is formed. The first opening OP1 may be formed in a line shape extending along a first direction I. The first mask pattern 143A may include a plurality of first openings OP1. The plurality of first openings OP1 may be arranged while being spaced apart from each other along the second direction II. The first mask pattern 143A including the first openings OP1 defines formation areas of trenches T in which bit lines are to be disposed. The first openings OP1 may at least partially overlap with portions of the string poles CPL. The first openings OP1 may at least partially overlap with portions of the channel layers CH.

After that, the second upper insulating layer 141 generated by the process of FIGS. 5A to 5C is etched by a partial thickness through an etching process using the first mask pattern 143A as an etching barrier, thereby forming trenches T in the second upper insulating layer 141. The trenches T are defined by the first openings OP1. The trenches T may be formed by not completely penetrating the second upper insulating layer 141 but penetrating the second upper insulating layer 141 by a partial thickness. Hereinafter, the second upper insulating layer including the trenches T is defined as a first mold-type second upper insulating layer 141A. The first mold-type second upper insulating layer 141A may be remain with a partial thickness between the trenches T and the string poles CPL.

The trenches T and the first openings OP1 may be formed using various fine pattern forming processes. Accordingly, the trenches T and the first openings OP1 may be formed with a narrower width than the channel layers CH, and two or more trenches may be overlapped on one channel layer. After the trenches T are formed, the second mask pattern 145 may be removed.

Figure 7A:
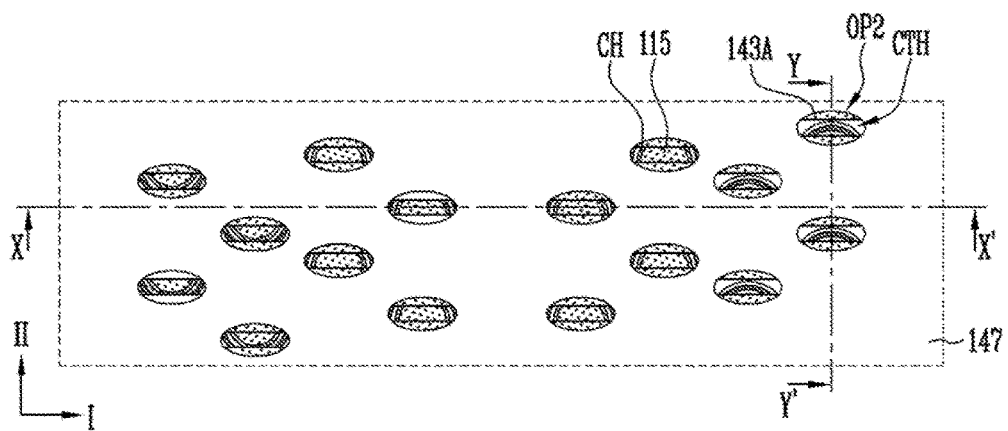
Figure 7B:
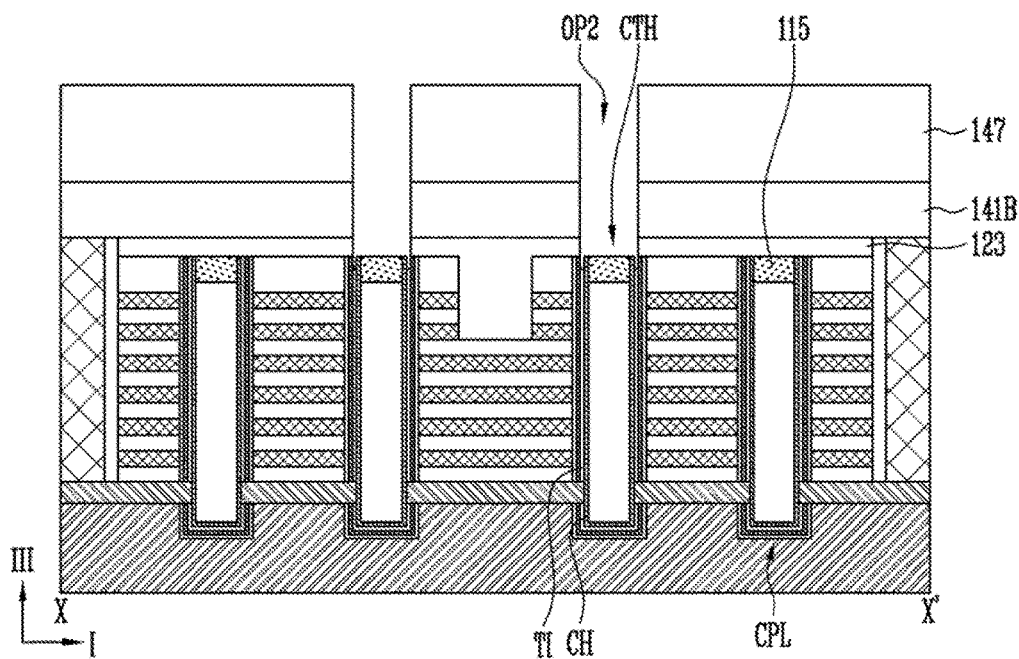
Figure 7C:
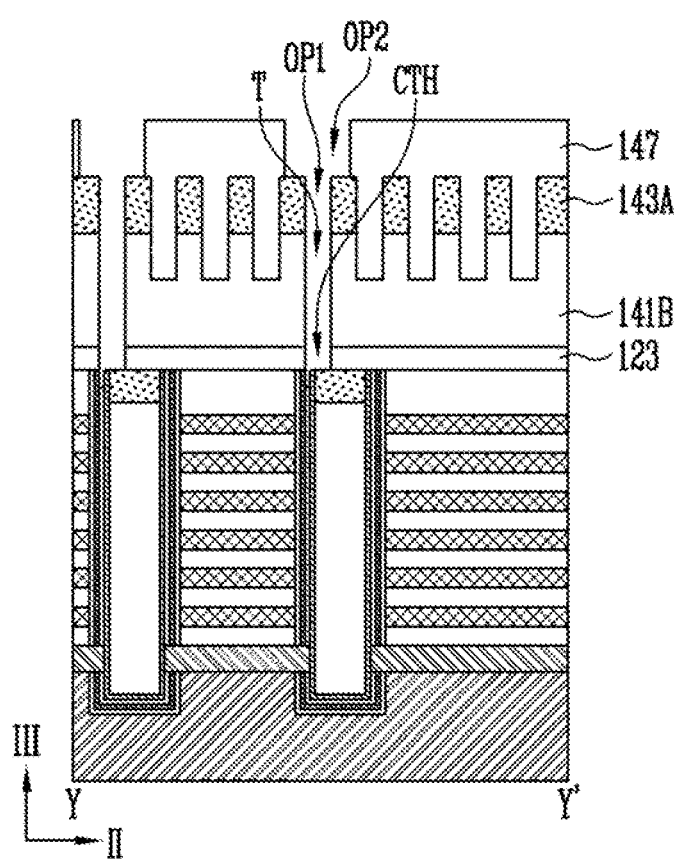

FIGS. 7A to 7C are views illustrating a process of forming recess areas.

Referring to FIGS. 7A to 7C, a third mask layer is formed on the first mold-type second upper insulating layer 141A generated by the process of FIGS. 6A to 6C and then patterned, thereby forming a hole-type third mask pattern 147 including a second opening OP2. The third mask layer may be a photoresist layer, and the third mask pattern 147 may be a photoresist pattern formed using a photolithography process.

The second opening OP2 may be formed in a hole type, and may be formed in an elliptical shape including a major axis along the first direction and a minor axis along the second direction II. Alternatively, the second opening OP2 may be formed in various shapes including a rectangular shape and the like. The second opening OP2 may expose a partial area of the trench T overlapped with the channel layer CH.

The second opening OP2 is not formed in a fine pattern but may be formed with a wider width than the trench T. When the second opening OP2 is not formed in the fine pattern, a high-priced exposure device is not employed when a photolithography process for forming the second opening OP2 is performed, thereby saving the manufacturing cost of the semiconductor device. When the second opening OP2 is not formed in the fine pattern, the second opening OP2 may at least partially overlap with not only a target channel layer overlapped with the trench T corresponding thereto but also a non-target channel layer that is disposed adjacent to the target channel layer and is not an opening target. In some embodiments, the non-target channel layer may be blocked by the first mask pattern 143A. Thus, when the second opening OP2 is not finely formed, the non-target channel layer overlapped with the second opening OP2 is not exposed by the first mask pattern 143A.

The third mask pattern 147 may include a plurality of second openings OP2. The plurality of second openings OP2 may be arranged in a zigzag pattern along the first direction I and the second direction II.

Subsequently, the first mold-type second upper insulating layer 141A generated by the process of FIGS. 6A and 6C and the first upper insulating layer 123 generated by the process of FIGS. 3A to 4B are etched through an etching process using the third mask pattern 147 and the first mask pattern 143A as etching barriers. Accordingly, a contact hole CTH penetrating the first mold-type second upper insulating layer 141A and the first upper insulating layer 123 is formed in an overlapping area of the first opening OP1 and the second opening OP2 or an overlapping area of the trench T and the second opening OP2. The capping layer 115 may be exposed through the contact hole CTH. Although not shown in these figures, when the area in which the capping layer 115 is disposed is filled with the channel layer CH, the channel layer CH may be exposed through the contact hole CTH. In some embodiments, since the first mask pattern 143A is used as an etching barrier in the process of forming the contact hole CTH, the contact hole CTH may be automatically aligned under the trench T, and the width of the contact hole CTH is limited to that of the first opening OP1. Accordingly, although the second opening OP2 is formed large, the contact hole CTH may be controlled to have a fine size limited by the width of the first opening OP1. Thus, it is possible to prevent two or more string poles CPL or two or more channel layers CH from being exposed by one contact hole CTH. Hereinafter, the second upper insulating layer including the trenches T and the contact holes CTH is defined as a second mold-type second upper insulating layer 141B. After the contact holes CTH are formed, the third mask pattern 147 is removed, and the first mask pattern 143A may be exposed.

Figure 8A:
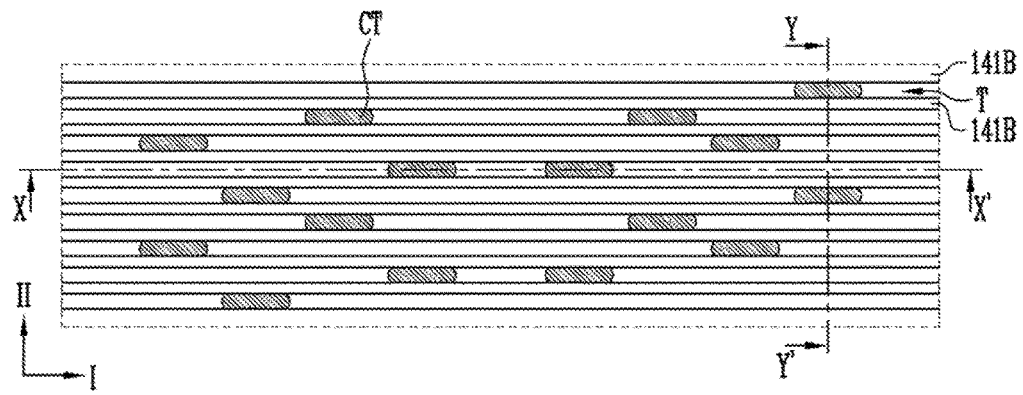
Figure 8B:
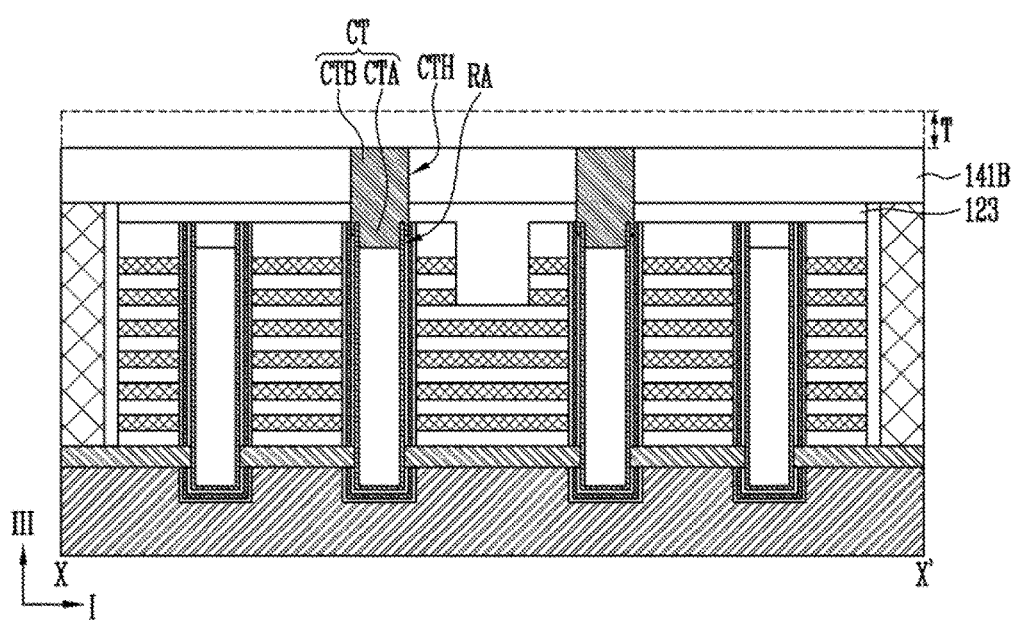

FIGS. 8A to 8C are views illustrating a process of forming contact plugs.

Referring to FIGS. 8A to 8C, the first mask pattern 143A generated by the process of FIGS. 6A and 6C is removed. The first mask pattern 143A formed, for example, of a nitride layer may be removed using a phosphoric acid. When the capping layer 115 is formed, the first mask pattern 143A is removed, and the capping layer 115 generated by the process of FIGS. 3A and 3B may be then removed. Hereinafter, the area in which the capping layer 115 is removed is defined as a recess area RA. An inner wall of the channel layer CH may be exposed through the recess area RA.

Subsequently, the contact hole CTH and the recess area RA may be filled with a contact plug CT. The contact plug CT may be contacted with the channel layer CH. The contact plug CT may include a first portion CTA filled in the recess area RA and a second portion CTB filled in the contact hole CTH. The contact plug CT may be formed of a conductive material. The first portion CTA may be contacted with the inner wall of the channel layer CH. The second portion CTB may extend from the first portion CTA and be integrated with the first portion CTA.

For example, in an embodiment, the contact plug CT may be formed by growing an epitaxial layer from the channel layer CH through selective epitaxial growth (SEG). In another embodiment, the contact plug CT may be formed by filling the contact hole CTH and the recess area RA with a conductive material. After the contact plug CT is formed, a dopant may be doped into the contact plug CT. The contact plug CT may be formed of doped polysilicon.

Figure 9A:
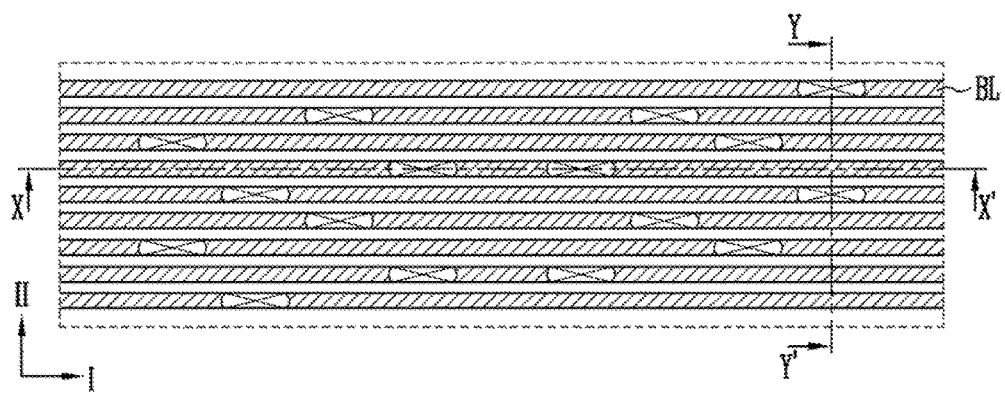
Figure 9B:
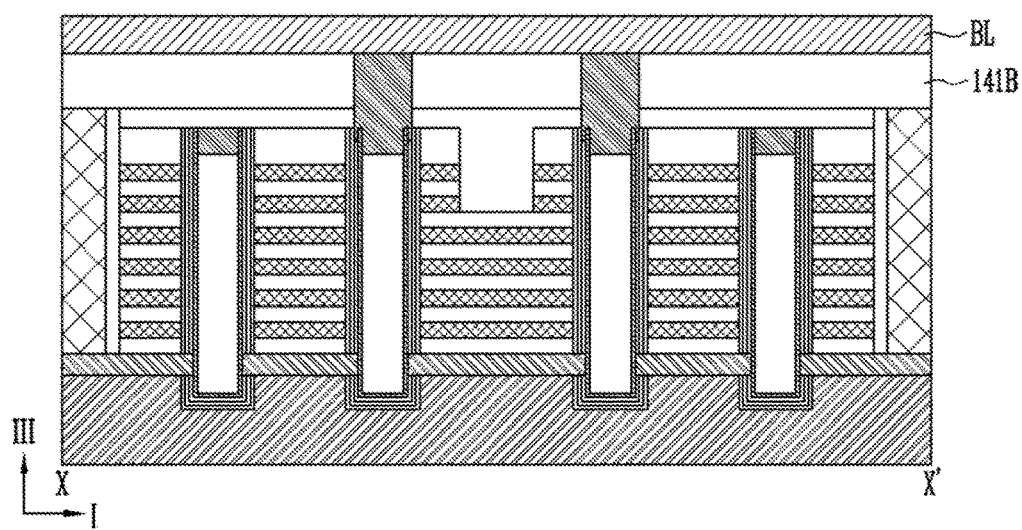
Figure 9C:
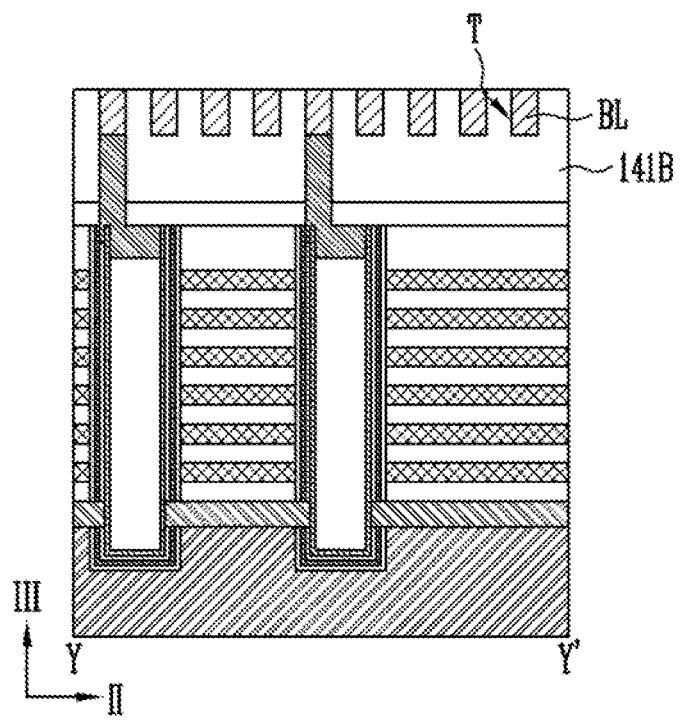

FIGS. 9A to 9C are views illustrating a process of forming bit lines.

Referring to FIGS. 9A to 9C, a conductive layer is deposited so that the trench T disposed in the second mold-type second upper insulating layer 141B is filled therewith, and a surface of the conductive layer is then planarized so that the second mold-type second upper insulating layer 141B is exposed, thereby forming a bit line BL contacted with the contact plug CT. The bit line BL may include copper for low-resistance wiring.

FIGS. 3A to 9C illustrates, as an example, a manufacturing method of the semiconductor device shown in FIG. 1B. However, it is noted, that the semiconductor device shown in FIG. 1A may also be manufactured using the processes described in FIGS. 3A to 9C.

In an embodiment of the present invention, the upper insulating layer is etched in the overlapping area between the first opening of the trench-type mask pattern and the second opening of the hole-type mask pattern, thereby forming the contact hole. Thus, the size of the contact hole may be controlled not to be larger than that of the first opening even though the size of the second opening is formed large. Accordingly, the width of the contact plug disposed inside the contact hole may be controlled to be narrow like the width of the bit line defined by the first opening, and it is possible to prevent a processing failure that two or more bit lines are connected to one contact plug. Also, the contact hole may be automatically aligned with the trench.

In an embodiment of the present invention, the width of the contact hole penetrating the upper insulating layer may be controlled to be narrow like the width of the first opening even though the width of the second opening is defined to be greater than that of the first opening. Accordingly, a high-priced exposure device is not used when the photolithography process for defining the second opening is performed, thereby saving the manufacturing cost of the semiconductor device.

Figure 10:
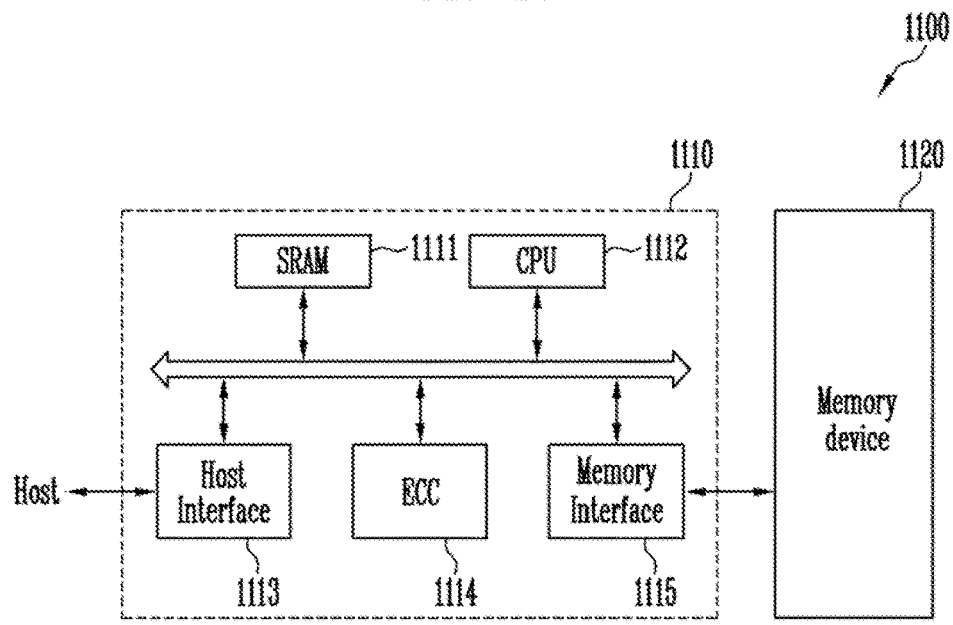
FIG. 10 is a block diagram illustrating a memory system, according to an embodiment of the present invention.

FIG. 10 is a block diagram illustrating a memory system 1100, according to an embodiment of the present invention.

According to the embodiment of FIG. 10, the memory system 1100 includes a memory controller 1110 and a memory device 1120.

The memory device 1120 may include any of the structures described in FIGS. 1A, 1B, and 2A to 2C. For example, the memory device 1120 may include contact plugs extending toward bit lines from channel layers, and the width of the contact plug along a direction intersecting the extending direction of the bit line may be limited to the width of the bit line. Also, the memory device 1120 may include a structure in which two or more bit lines are overlapped at least partially on one channel layer.

The memory device 1120 may be a multi-chip package formed of a plurality of flash memory chips.

The memory controller 1110 is configured to control the memory device 1120, and may include a static random access memory (SRAM) 1111, a central processing unit (CPU) 1112, a host interface 1113, an error correction code (ECC) unit 1114, and a memory interface 1115. The SRAM 1111 is used as an operation memory of the CPU 1112. The CPU 1112 performs a general control operation for data exchange of the memory controller 1110. The host interface 1113 includes a data exchange protocol for a host connected with the memory system 1100. The ECC unit 1114 detects and corrects an error included in a data read from the memory device 1120. The memory interface 1115 interfaces with the memory device 1120. In addition, the memory controller 1110 may further include a read only memory (ROM) for storing code data for interfacing with the host, and the like.

The memory system 1100 configured as described above may be a memory card or a solid state disk (SSD), in which the memory device 1120 is combined with the controller 1110. For example, when the memory system 1100 is an solid state drive (SSD), the memory controller 1100 may communicated with the external (e.g., the host) through one among various interface protocols, such as, for example, a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol.

Figure 11:
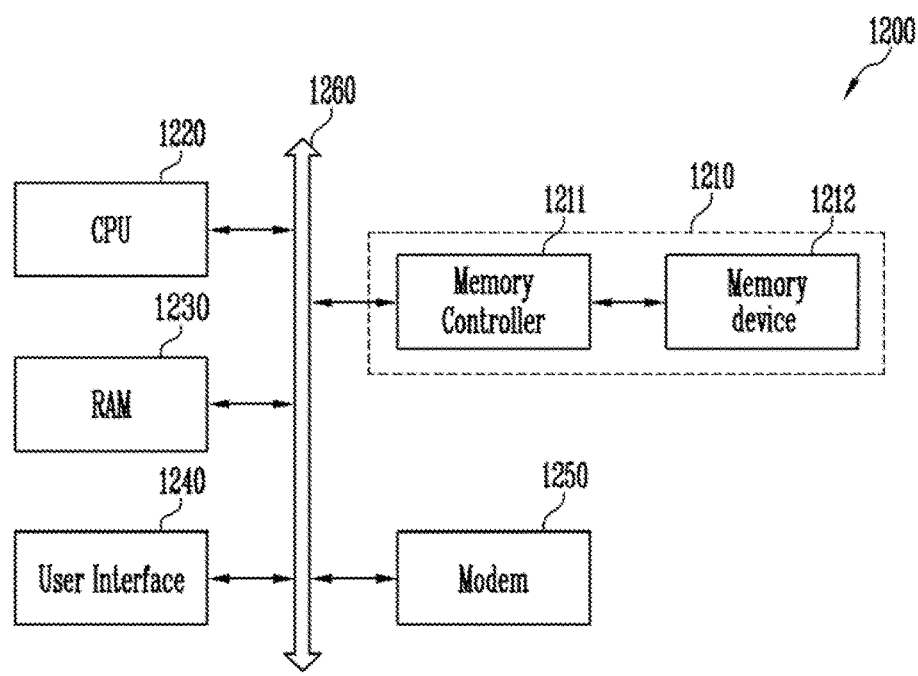
FIG. 11 is a block diagram illustrating a computing system, according to an embodiment of the present invention.

FIG. 11 is a block diagram illustrating a computing system 1200, according to an embodiment of the present invention.

According to the embodiment of FIG. 11, the computing system 1200 may include a memory system 1210, a central processing unit (CPU) 1220, a random access memory (RAM) 1230, a user interface 1240, and a modem 1250, which are electrically connected to a system bus 1260. When the computing system 1200 is a mobile device, a battery for supplying an operation voltage to the computing system 1200 may be further included. Also, an application chip set, a camera image processor (CIS), a mobile D-RAM, and the like may be further included.

The memory system 1210 of FIG. 10, may be configured with a memory device 1212 and a memory controller 1211.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and/or scope of the present invention as set forth in the following claims.

What is claimed is:

1. A semiconductor device comprising:
a stack including interlayer dielectric layers and conductive patterns, which are alternately stacked;
a channel layer penetrating the stack;
an upper insulating layer formed over the stack to cover the channel layer;
a bit line disposed in the upper insulating layer while being spaced apart from the channel layer, the bit line being overlapped with a portion of the channel layer; and
a contact plug having the same width as the bit line in a width direction perpendicular to the extending direction of the bit line, the contact plug penetrating the upper insulating layer, the contact plug extending toward the bit line from the channel layer.

2. The semiconductor device of claim 1, further comprising a source line disposed under the stack.

3. The semiconductor device of claim 2, wherein the source line includes a first source layer and a second source layer disposed on the first source layer, and
the channel layer extends to the inside of the first source layer by penetrating the second source layer, and is contacted with the second source layer.

4. The semiconductor device of claim 1, wherein the diameter of the channel layer in the width direction is greater than that of the contact plug protruding upward of the channel layer.

5. The semiconductor device of claim 1, wherein the contact plug protruding upward of the channel layer completely covers the channel layer in the extending direction of the bit line, and covers a portion of the channel layer in the width direction.

6. The semiconductor device of claim 1, wherein the contact plug includes doped silicon.

7. The semiconductor device of claim 1, wherein the contact plug includes a portion extending toward a central area of the channel layer under the upper insulating layer, the portion being surrounded by the channel layer.

* * * * *